United States Patent

Miyanishi et al.

Patent Number: 5,557,270
Date of Patent: Sep. 17, 1996

[54] DUAL CONVERSION DECODER

[75] Inventors: Atushi Miyanishi; Hisashi Matsumoto; Yoshiki Tsujihashi, all of Itami, Japan

[73] Assignee: Mitsubishi Denki Kabushiki Kaisha, Tokyo, Japan

[21] Appl. No.: 295,999

[22] Filed: Aug. 25, 1994

[30] Foreign Application Priority Data

Aug. 25, 1993 [JP] Japan ................... 5-210379

[51] Int. Cl.$^6$ .................................................. H03M 7/14
[52] U.S. Cl. ............................ 341/50; 341/102; 341/104
[58] Field of Search .............................. 341/50, 62, 104, 341/102

[56] References Cited

U.S. PATENT DOCUMENTS 3,631,465  12/1971  Heeren ........................ 340/347 DD
3,851,186  11/1979  Koo ............................ 307/205
4,308,526  12/1981  Smith .......................... 340/347 DD

FOREIGN PATENT DOCUMENTS 63-151223  6/1988  Japan.
63-156427  6/1988  Japan.

OTHER PUBLICATIONS

Tietze, Schenk, Halbleiter–Schaltungstechnik (Semiconductor Circuit Technology), 9th edition, Berlin, Springer–Verlag (Publisher), 1991, pp. 225 and 732–735. No translation provided.

Assistant Examiner—Jason L. W. Kost
Attorney, Agent, or Firm—Thomas R. Morrison; Christopher R. Pastel

[57] ABSTRACT

A decoder has first and second decoder circuits for producing dual sets of outputs. The first decoder circuit is responsive to input lines $B_1$–$B_n$ representative of a binary value x and has first outputs $Z_1$–$Z_m$ where $m=2^n$. In response to the value x applied to the first decoder, output line $Z_{x+1}$ is set high while the remainder are set low. The second decoder circuit comprises m transmission gates serially connected between a first and a second potential. The transmission gates are each directly driven by a respective one of said first outputs $Z_1$–$Z_m$. The second decoder circuit generates second outputs $Y_1$–$Y_{m-1}$ at junctions of the transmission gates. In response to the value x applied to the first decoder, x number of the outputs $Y_1$–$Y_{m-1}$ are set high beginning with the least significant output $Y_1$ and continuing consecutively up to the output $Y_x$ with the remainder being set low.

12 Claims, 5 Drawing Sheets

DUAL CONVERSION DECODER

BACKGROUND OF THE INVENTION

The present invention relates to a digital decoder and, more particularly, to a decoder for simultaneously effecting two conversion methods to produce a dual sets of outputs. The decoder is implemented on an integrated circuit substrate using MOS FET's (field effect transistors). The decoder operates to convert a binary input of n bits, having a value x, into two decoded outputs, each having a different format. In a first method, output lines $Z_1-Z_m$ exist, $m=2^n$, and only output line $Z_{x+1}$ is set high while the remainder are set low in response to a binary input having a value x. In a second method, there are (m−1) output lines, $Y_1-Y_{(m-1)}$, with $Y_1$ being the least significant. The second method produces a decoded output wherein x output lines are set high beginning with $Y_1$ up to $Y_x$ with the remaining lines being set low. For instance, if the value of x is three then $Y_1-Y_3$ are set high and if x is 0 then no lines are set high.

Various configurations of decoders exist. A first type of decoder is shown in Japanese laid open Patent Publication (KOKAI) No. SHO 63151223 which discloses a 3 to 8 line decoder as an embodiment. The decoder implements the first method of conversion wherein one output line is set high dependent upon the binary value of the input lines. For example, consider a decoder having three input lines $B_1$, $B_2$ and $B_3$ and eight output lines $Z_1-Z_8$. If the binary value of the input on lines $B_1-B_3$ is x, then output line $Z_{x+1}$ is set high while the remainder are set low.

A second type of decoder implements the second method of conversion wherein there are n input lines $B_1$, $B_2$, and $B_3$, where n is 3, and ($2^n-1$) output lines. Thus, where n is 3 there are seven output lines $Y_1-Y_7$. More generally, there are outputs $Y_1-Y_{(m-1)}$, with $Y_1$ being the least significant and $m=2^n$. The second method produces a decoded output wherein x output lines are set high, $Y_1-Y_x$, and the remainder are set at zero.

The decoders are implemented by logic circuitry specific to the desired functional output. The logic circuitry employs various typical logic gates including inverters, AND gates, OR gates and gates executing other logic functions. Each of the known decoders executes a single function, or conversion method. Situations exist wherein decoded outputs generated by both methods are required. A typical solution to this requirement is to provide two decoders having common inputs, and individual sets of outputs. This approach of using multiple function specific circuits results in increased complexity and an increase in the number of circuit elements.

A conversion decoder is disclosed in Japanese laid open Patent Publication (KOKAI) No. 63156427. The conversion decoder converts output of the first method into output formated according to the second method. Specifically, input in the form $Z_1-Z_8$ of the first method is converted into output corresponding to the form of $Y_1-Y_7$ of the second method for each value of x. This type of decoder is sometimes referred to as an allotting decoder.

By using the conversion decoder above in conjunction with the first decoder discussed above, both forms of decoded output are obtainable. The outputs of the first decoder are input to the conversion decoder to obtain another set of outputs having the format of the second decoder. While both types of outputs are achieved without incorporating all the circuitry of the second decoder, the resulting serial combination is complex and requires a significant number of circuit elements. Input to output time delays are also increased in accordance with the number of elements. Thus, there exists a need for a dual conversion decoder with fewer circuit elements and reduced complexity.

OBJECTS AND SUMMARY OF THE INVENTION

Accordingly, it is an object of the invention to provide a dual conversion decoder which overcomes the drawbacks of the prior art.

It is a further object of the invention to provide a dual decoder producing first and second output in response to a binary coded input according to first and second decoding/conversion methods.

It is a still further object of the invention to provide a dual decoder requiting fewer circuit elements than combinations of the prior art have heretofore required.

It is yet another object of the invention to provide a dual decoder wherein usage of inverters is economized by integrating functions of inverters.

It is still another object of the invention to provide dual decoded outputs with a minimal delay time differential while minimizing the number of circuit elements.

An object of the present invention is to provide a dual decoder utilizing primarily inverting logic functions wherein a decoder circuit for implementing a first method of decoding and a conversion circuit for implementing a code conversion method are combined in a modified arrangement allowing efficient use of circuit elements.

Briefly stated, the present invention provides a decoder having first and second decoder circuits for producing dual outputs. The first decoder circuit is responsive to input lines $B_1-B_n$ representative of a binary value x and has first outputs $Z_1-Z_m$, where $m=2^n$. In response to the value x applied to the first decoder, output line $Z_{x+1}$ is set high while the remainder are set low. The second decoder circuit comprises m transmission gates serially connected between a first and a second potential. The transmission gates are each directly driven by a respective one of said first outputs $Z_1-Z_m$. The second decoder circuit generates second outputs $Y_1-Y_{m-1}$ at junctions of the transmission gates. In response to the value x applied to the first decoder, x number of the outputs $Y_1-Y_7$ are set high beginning with the least significant output $Y_1$ and continuing consecutively up to the output $Y_x$ with the remainder being set low.

In accordance with these and other objects of the invention, there is provided a decoder comprising: a first decoder circuit responsive to n binary inputs representative of a binary coded decimal value x, the first decoder having m first outputs $Z_1-Z_m$ supplied through m output drivers where $m=2^n$, $n \geq 2$, and $Z_1$ is the least significant output; the first decoder circuit including means for setting to a first state an output $Z_{x+1}$, of the first outputs $Z_1-Z_m$, and setting remaining ones of the first outputs $Z_1-Z_m$ to a second state; a second decoder circuit having m−1 second outputs $Y_1-Y_{m-1}$ wherein $Y_1$ is the least significant; the second decoder circuit having means for setting to the first state x number of the second outputs $Y_1-Y_{m-1}$ in order of significance from the least significant second output $Y_1$ to a more significant second output $Y_x$ in response to the first outputs $Z_1-Z_m$, and setting remaining ones of the second outputs $Y_{x+1}-Y_{m-1}$ to the second state; and the means for setting including m transmission gates having an input gate driven by a respective one of the m output drivers of the first decoder circuit.

According to a feature of the present invention there is provided a decoder, for receiving n input bits, representative of a binary coded decimal value x, and producing first and second sets of decoded output, comprising: a first decoder circuit responsive to the n input bits; the first decoder having m first outputs $Z_1$-$Z_m$ supplied through m output drivers where $m=2^n$, $n \geq 2$, and $Z_1$ is the least significant output; the first decoder circuit includes m logic gates driving the m output elements; means for inverting the n binary inputs; each of the m logic gates having means for applying different combinations of the n input bits and inversions of the n input bits to inputs of the m logic gates such that an output $Z_{x+1}$, of the first outputs $Z_1$-$Z_m$, is set to a first state and remaining ones of the first outputs $Z_1$-$Z_m$ are set to a second state; a second decoder circuit accepting first outputs $Z_1$-$Z_m$ as inputs; the second decoder circuit having m-1 second outputs $Y_1$-$Y_{m-1}$, where $Y_1$ is the least significant and $Y_{m-1}$ is the most significant; the second decoder circuit having means for setting to the first state x number of the second outputs $Y_1 Y_{m-1}$ in order of significance from the least significant second output $Y_1$ to a more significant second output $Y_x$ in response to the first outputs $Z_1$-$Z_m$, and setting remaining ones of the second outputs $Y_{x+1}$-$Y_{m-1}$ to the second state; and the means for setting including m transmission gates having an input gate driven by a respective one of the m output drivers of the first decoder circuit.

The present invention also includes the above embodiments wherein, in the alternative, various implementations of features of the above embodiments are incorporated. For example a decoder according to the present invention is realizable where the transmission gates are serially connected between a first potential and a second potential; the second outputs $Y_1$-$Y_{m-1}$ are generated at junctions of the transmission gates; and the transmission gates are rendered non-conductive in response to a corresponding one of the first outputs being set to the first state.

The present invention also includes the above embodiments wherein, in the alternative, the m output drivers of the first decoder circuit are inverters; each of the m transmission gates includes a P-channel FET and an N-channel FET connected in parallel; and each of the transmission gates includes a second input gate driven by an input signal applied to the respective one of the m output drivers.

According to still other variations of the above embodiments of the present invention, the first decoder circuit includes m logic gates driving the m output elements; means for inverting the n binary inputs; and each of the m logic gates having a different combination of the n binary inputs and inversions of the n binary inputs applied to inputs thereof.

The above, and other objects, features and advantages of the present invention will become apparent from the following description read in conjunction with the accompanying drawings, in which like reference numerals designate the same elements.

DETAILED DESCRIPTION OF EMBODIMENTS

Figure 1:
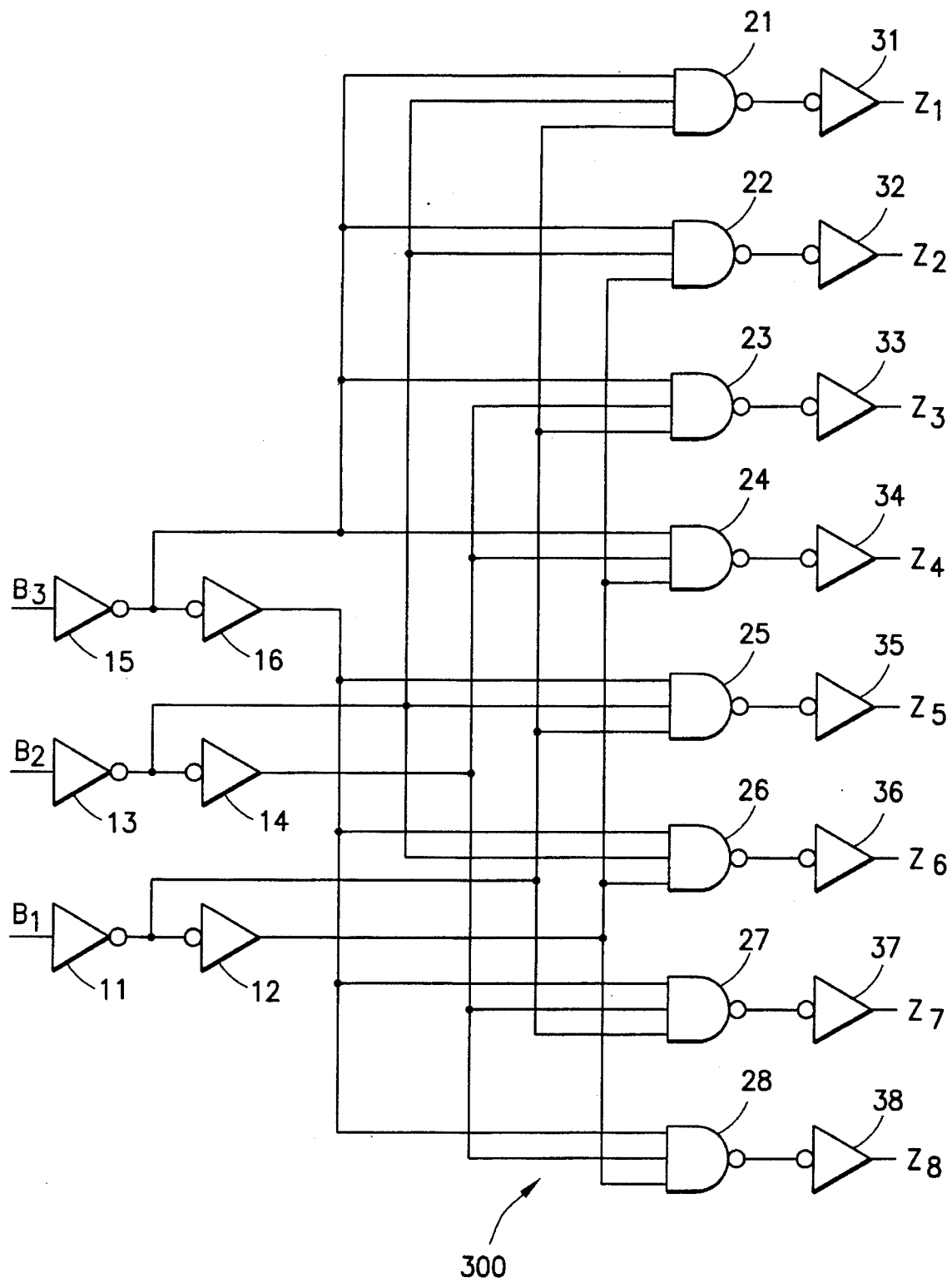
FIG. 1 is a schematic of a conventional decoder for implement decoding according to a first method.

Referring to FIG. 1, a first decoder 300 has 3-to-8 line configuration and is similar in design to that of a decoder disclosed in Japanese laid-open patent publication no. 63-151223. Input lines $B_1$-$B_3$ carry bits having a binary value x. Output lines $Z_1$-$Z_8$ carry a decoded output associated with a given value of x input on lines $B_1$-$B_3$.

As a matter of convention throughout this specification, lines and signals occurring on the particular lines are referred to using the same reference designator. Also, the subscripts of the reference designators indicate the significance, or weight, that the corresponding signal has in determining the binary value of a digital word. For instance, the subscript "1" indicates that the signal is of the least significance. Furthermore, particular signals, or bits, will be refereed to as "first", "second", and so on in correspondence with their reference designator.

Although the embodiment presented in FIG. 1 is a 3-to-8 line decoder, the method of operation will be described generally in terms of n where n is the total number of inputs. When a binary word having the value x is input to the first decoder 300, output line $Z_{x+1}$ is set high while the remainder are set low in response to the binary input. The functioning of the first decoder 300 illustrated by TRUTH TABLE 1 below.

TABLE 1

| | TRUTH | | | | | | | | | | |
|---|---|---|---|---|---|---|---|---|---|---|---|
| INPUT VALUE | BINARY OUTPUT | | | OUTPUT | | | | | | | |
| X | $B_3$ | $B_2$ | $B_1$ | $Z_8$ | $Z_7$ | $Z_6$ | $Z_5$ | $Z_4$ | $Z_3$ | $Z_2$ | $Z_1$ |
| 0 | 0 | 0 | 0 | 0 | 0 | 0 | 0 | 0 | 0 | 0 | 1 |
| 1 | 0 | 0 | 1 | 0 | 0 | 0 | 0 | 0 | 0 | 1 | 0 |
| 2 | 0 | 1 | 0 | 0 | 0 | 0 | 0 | 0 | 1 | 0 | 0 |
| 3 | 0 | 1 | 1 | 0 | 0 | 0 | 0 | 1 | 0 | 0 | 0 |
| 4 | 1 | 0 | 0 | 0 | 0 | 0 | 1 | 0 | 0 | 0 | 0 |
| 5 | 1 | 0 | 1 | 0 | 0 | 1 | 0 | 0 | 0 | 0 | 0 |
| 6 | 1 | 1 | 0 | 0 | 1 | 0 | 0 | 0 | 0 | 0 | 0 |
| 7 | 1 | 1 | 1 | 1 | 0 | 0 | 0 | 0 | 0 | 0 | 0 |

The first decoder 300 includes inverters 11–16, NAND gates 21–28, and inverters 31–38. A first input signal $B_1$ is coupled through inverter 11 to NAND gates 21, 23, 25 and 27, and its re-inverted version is coupled through inverter 12 to NAND gates 22, 24, 26 and 28. A second input signal $B_2$ is coupled through inverter 13 to NAND gates 21, 22, 25 and 26, and its re-inverted version is coupled through inverter 14 to NAND gates 23, 24, 27 and 28. A third input signal applied at an input line $B_3$ is coupled through inverter 15 to NAND gates 21, 22, 23 and 24, and its inverted version is coupled through inverter 16 to NAND gates 25, 26, 27 and 28. Output signals from NAND gates 21–28 pass through respective output inverters 31–38 to output lines $Z_1$-$Z_8$.

Generally, semiconductor integrated circuits, particularly those using MOSFET construction, use inverting gate functions such as NAND gates, NOR gates, and inverting signal buffers, which are easier to fabricate and require less substrate area than AND gates, OR gates, and non-inverting signal buffers. Furthermore, inverters formed by P-channel and N-channel FET's in combination are useful not only for inverting signals but also for both amplifying and buffering signals applied to other logic circuits. Accordingly, decoders, such as the first decoder 300, are often fabricated using MOSFET's on a semiconductor integrated circuit substrate configured as inverting logic as shown in FIG. 1.

Upon application of a value x to the inputs $B_1$–$B_3$, a first method sets only output line $Z_{x+1}$ high while the remainder of the output lines $Z_1$–$Z_m$, where $m=2^n$ and n is the number of input bits, are set low. The output signals $Z_1$–$Z_8$, derived according to the first method, are expressible as logic products of input signals $B_1$–$B_3$ and/or their inverted versions in accordance with the following logic expressions.

$Z_1=\bar{B}_1 \cdot \bar{B}_2 \cdot \bar{B}_3$ $Z_2=\bar{B}_1 \cdot \bar{B}_2 \cdot \bar{B}_3$ $Z_3=\bar{B}_1 \cdot \bar{B}_2 \cdot \bar{B}_3$ $Z_4=\bar{B}_1 \cdot \bar{B}_2 \cdot \bar{B}_3$ $Z_5=\bar{B}_1 \cdot \bar{B}_2 \cdot \bar{B}_3$ $Z_6=\bar{B}_1 \cdot \bar{B}_2 \cdot \bar{B}_3$ $Z_7=\bar{B}_1 \cdot \bar{B}_2 \cdot \bar{B}_3$ $Z_8=\bar{B}_1 \cdot \bar{B}_2 \cdot \bar{B}_3$ For example, if the input value x was set to 4 and applied to input lines $B_1$–$B_3$, then, $B_1$=0, $B_2$=0 and $B_3$= 1. According to the above logical expressions, $Z_1$ through $Z_4$ are set to 0, $Z_5$ is set to 1, and $Z_6$ through $Z_8$ are set to 0. Henceforth, every value of x will set a single one of the output lines $Z_1$ through $Z_8$ high, thus indicating the value of x.

Figure 2:
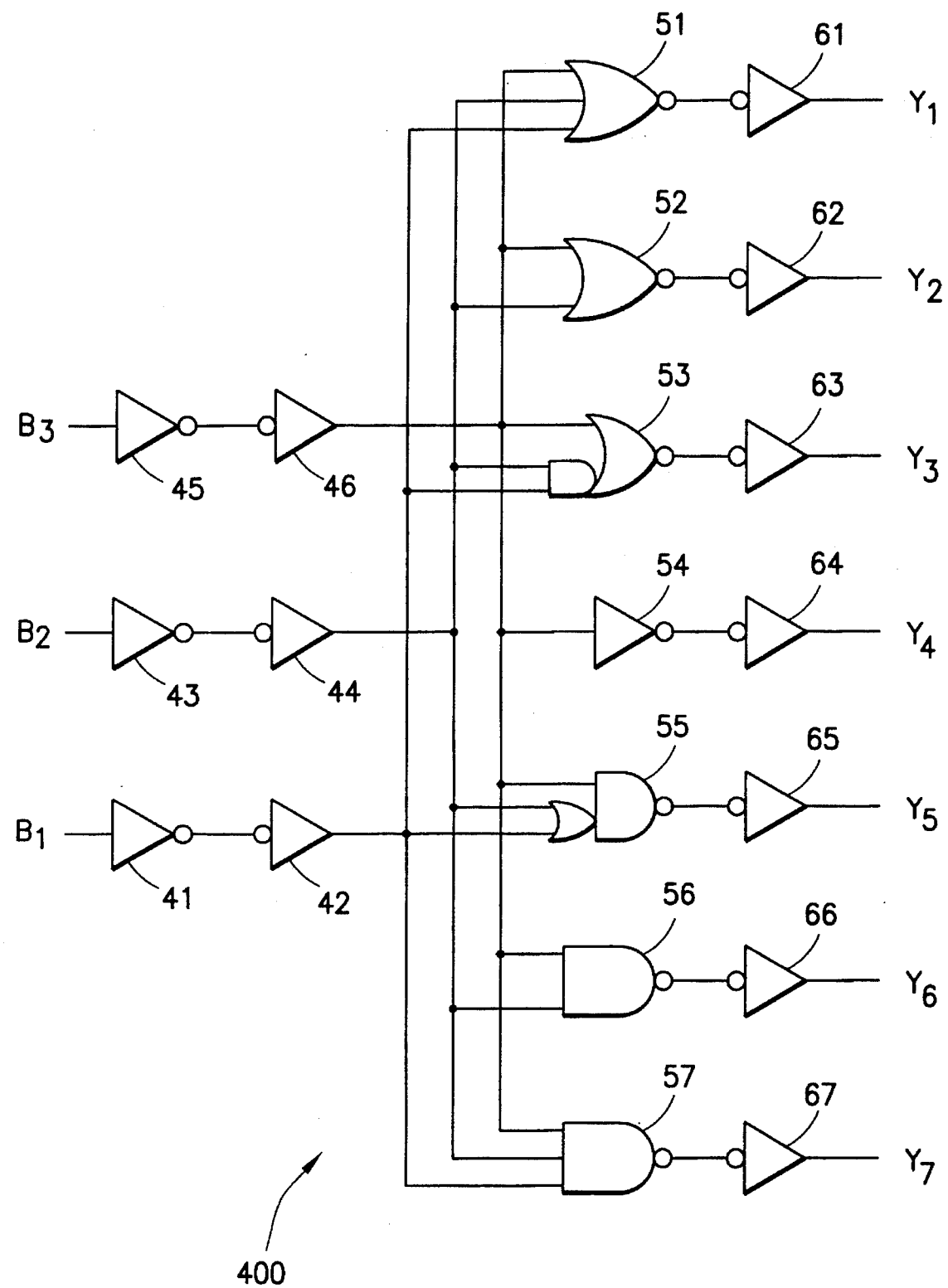
FIG. 2 is a schematic of a conventional decoder for implementing decoding according to a second method.

Referring to FIG. 2, a second decoder 400, having a conventional design, has a 3-to-7 line configuration with input lines $B_1$–$B_3$ and output lines $Y_1$–$Y_7$. The second decoder 400 includes inverters 41–46, NOR gates 51 and 52, an AND-NOR gate 53, an inverter 54, an OR-NAND gate 55, NAND gates 56 and 57, and inverters 61–67. The first input line $B_1$ is coupled to NOR gate 51, the AND section of AND-NOR gate 53, the OR section of OR-NAND gate 55, and NAND gate 57. The second input line $B_2$ is coupled to NOR gates 51 and 52, the AND section of AND-NOR gate 53, the OR section of OR-NAND gate 55, and NAND gates 56 and 57. Finally, the third input line $B_3$ is coupled to gates 51–53, inverter 54, and gates 55–57. Outputs of gates 51–53, inverter 54 and gates 55–57 are coupled through their associated inverters 61–67 to generate outputs $Y_1$–$Y_7$, respectively.

According to a second conversion method, when the second decoder 400 has a value x is applied to the inputs $B_1$–$B_3$, x number of the outputs $Y_1$–$Y_7$ are set high beginning with the least significant output $Y_1$ and continuing consecutively up to the output $Y_x$ with the remainder being set low. The output signals appearing on output lines $Y_1$–$Y_7$ are derived according to the second conversion method and can be expressed as follows.

$Y_1=B_1+B_2+B_3$ $Y_2=B_2+B_3$ $Y_3=(B_1 \cdot B_2)+B_3$ $Y_4=B_3$ $Y_5=(B_1+B_2) \cdot B_3$ $Y_6=B_2 \cdot B_3$ $Y_7=B_1 \cdot B_2 \cdot B_3$ For example, if an input decimal value of x is 4, $B_1$=0, $B_2$=0, and $B_3$=1, the above logic expressions yield a signal "1" on output lines $Y_1$–$Y_4$ and a signal "0" on output lines $Y_5$–$Y_7$.

In order to implement a decoder that produces outputs according to both sets of logical equations, one might attempt to combine the first decoder 300 with the second decoder 400. In such a combination, inverters 11–16 of the first decoder can also perform the function of inverters 41–46 of the second decoder 400, thereby permitting the elimination of inverters 41–46. However, output inverters 31–38, generating the outputs $Z_1$–$Z_8$ of the first decoder 300, cannot take the place of inverters 61–67 producing outputs $Y_1$–$Y_7$. Therefore, the number of circuit elements increases rapidly as the number of input signal bits increases.

Figure 3:
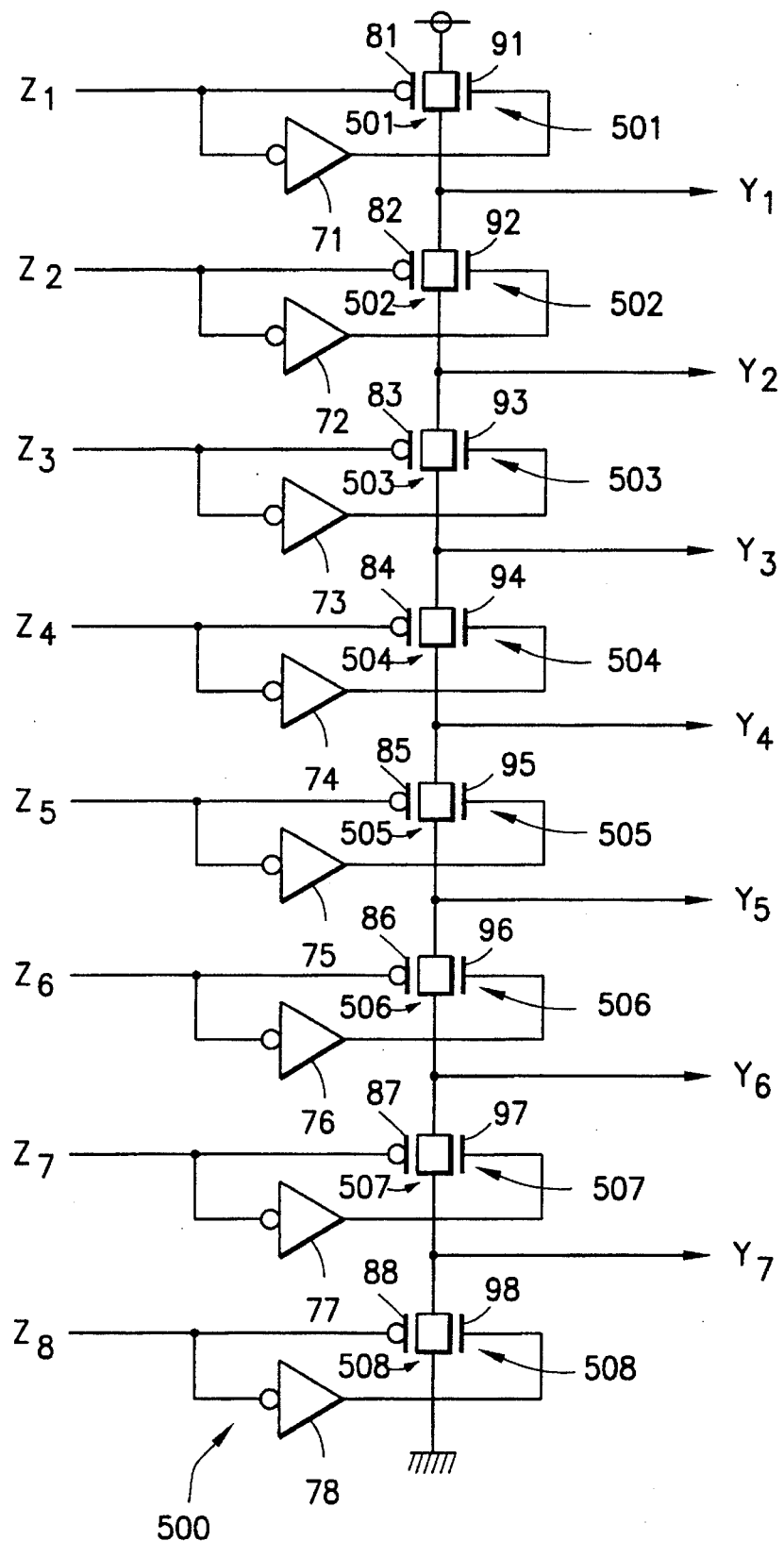
FIG. 3 is a schematic of a conventional code conversion circuit for converting output of the decoder of FIG. 1 to output in accordance with the second method of the decoder of FIG. 2.

Referring to FIG. 3, a conversion decoder 500 has substantially the same design as an allotting decoder disclosed in the Japanese laid-open patent publication (KOKAI) No. 63156427. The conversion decoder converts output of the first decoder 300 into output corresponding to that of the second decoder 400. Input in the form of signals $Z_1$–$Z_8$, generated by the first decoder 300, is converted into output signals $Y_1$–$Y_7$ corresponding to the second conversion method used in the second decoder 400. TRUTH TABLE 3 below summarizes the input and output states of the conversion decoder 500 for each possible value of x for the embodiments of FIGS. 1 and 2.

TABLE 3

| INPUT VALUE | TRUTH | | | | | | | | | | | | | | |
|---|---|---|---|---|---|---|---|---|---|---|---|---|---|---|---|
| | INPUT | | | | | | | | OUTPUT | | | | | | |
| X | $Z_8$ | $Z_7$ | $Z_6$ | $Z_5$ | $Z_4$ | $Z_3$ | $Z_2$ | $Z_1$ | $Y_7$ | $Y_6$ | $Y_5$ | $Y_4$ | $Y_3$ | $Y_2$ | $Y_1$ |
| 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 0 | 1 | 0 | 0 | 0 | 0 | 0 | 0 | 0 | 1 |
| 2 | 0 | 0 | 0 | 0 | 0 | 1 | 0 | 0 | 0 | 0 | 0 | 0 | 0 | 1 | 1 |
| 3 | 0 | 0 | 0 | 0 | 1 | 0 | 0 | 0 | 0 | 0 | 0 | 0 | 1 | 1 | 1 |
| 4 | 0 | 0 | 0 | 1 | 0 | 0 | 0 | 0 | 0 | 0 | 0 | 1 | 1 | 1 | 1 |
| 5 | 0 | 0 | 1 | 0 | 0 | 0 | 0 | 0 | 0 | 0 | 1 | 1 | 1 | 1 | 1 |
| 6 | 0 | 1 | 0 | 0 | 0 | 0 | 0 | 0 | 0 | 1 | 1 | 1 | 1 | 1 | 1 |
| 7 | 1 | 0 | 0 | 0 | 0 | 0 | 0 | 0 | 1 | 1 | 1 | 1 | 1 | 1 | 1 |

The conversion decoder 500 includes eight transmission gates 501–508 comprised of parallel combinations of PMOS FET's 81–88 and NMOS FET's 91–98. The transmission gates 501–508 are connected in series between a power supply potential and ground. The conversion decoder 500 further includes gate drive inverters 71–78, each receiving one of the input signals $Z_1$–$Z_8$. Each of the gate drive inverters 71–78 drive a gate of an associated one of NMOS FET's 91–98. Input signals $Z_1$–$Z_8$ are also applied to the gates of the PMOS FET's 81–88. Output lines $Y_1$–$Y_7$ extend from respective junctions of the transmission gates 501–508. It is realized that although the instant embodiment uses MOS FET's, alternative devices such as JFET's and similar switching elements may be used in place of MOS FET's without departing from the scope and spirit of the present invention.

The PMOS FET's 81–89 and NMOS FET's 91–98 are conductive when signals on their respective input lines $Z_1$–$Z_8$ are low, i.e. set to "0". Conversely, the transmission gates 501–508 are rendered non-conductive when the corresponding inputs of signals $Z_1$–$Z_8$ are set high, i.e. set to "1". Thus, since only one of the inputs $Z_1$–$Z_8$ is set high at a given time, the input which is set high turns off its associated transmission gate dividing the serially connected transmission gates 91–98 such that outputs on the power supply side of the non-conductive gate are set high while outputs on the ground side are set low. For example, when the x value is 4, input signal $Z_5$ is set high and transmission gate 505 is turned off while the remainder of the transmission gates 501–504 and 506–508 are conductive. Therefore, outputs $Y_1$–$Y_4$ are set high and outputs $Y_5$–$Y_7$ are set low.

In order to achieve a decoder capable of producing outputs according to both the first and second methods, one could derive outputs according to the first method from the first decoder 300 and then derive outputs according to the second method from the conversion decoder 500 connected to the outputs $Z_1$–$Z_8$ of the first decoder. This serial combination yields a complex circuit having numerous elements and associated delay times.

Figure 4:
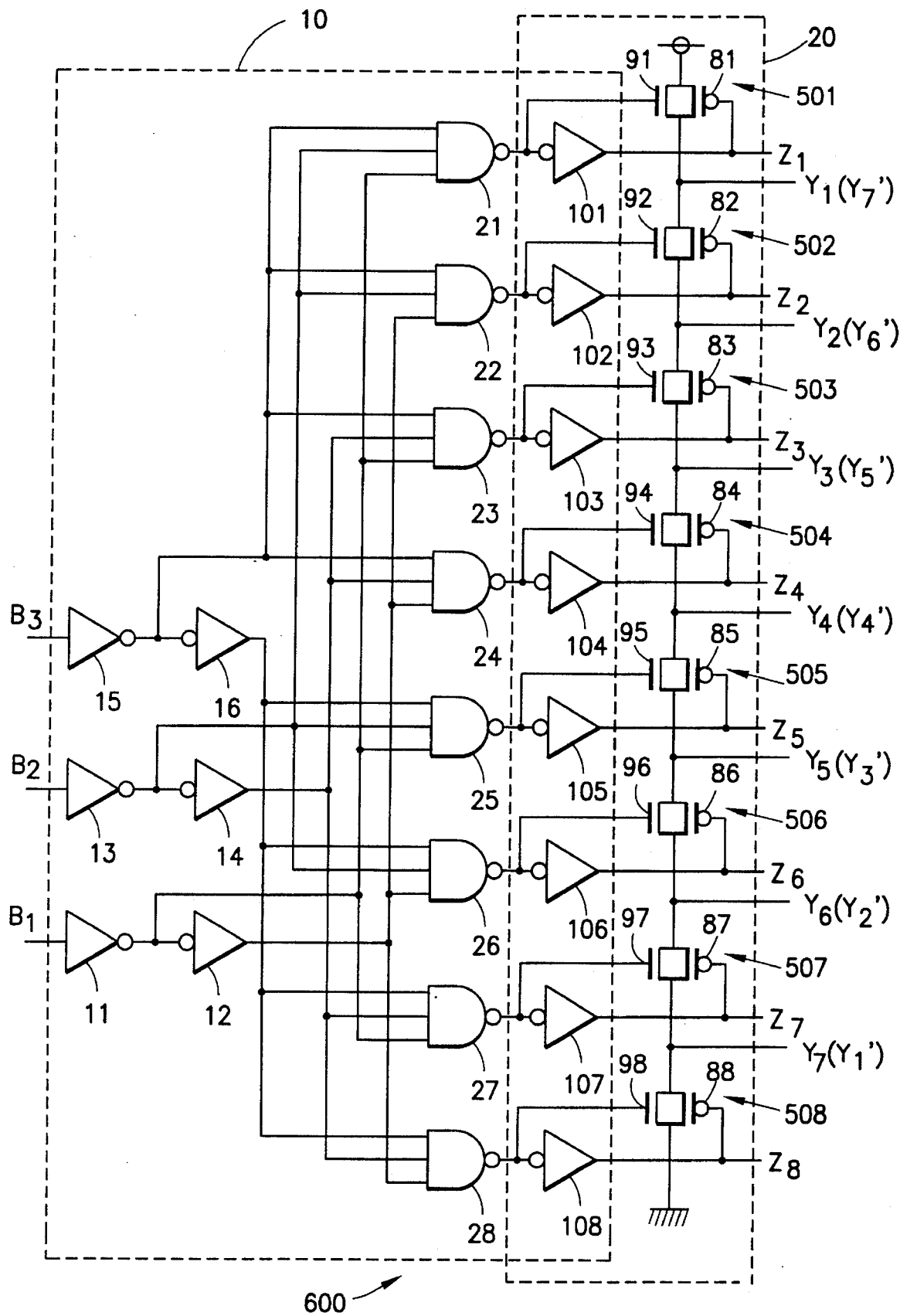
FIG. 4 shows a first dual decoder according to an embodiment of the present invention.

Referring to FIG. 4, a first dual decoder 600, of the present invention, combines features of the first decoder 300 of FIG. 1 and the conversion decoder 500 of FIG. 3. A first decoder circuit 10 includes the circuitry of the first decoder 300. Corresponding reference designators indicate corresponding components of each circuit. Similarly, a first conversion circuit 20 includes circuitry corresponding to that of the conversion decoder 500 of the FIG. 3 wherein corresponding reference designators indicate corresponding elements. The first conversion circuit produces second outputs $Y_1$–$Y_7$. The output inverters 101–108 are included in both the first decoder and conversion circuits, 10 and 20. The inverters 101–108 serve double duty, performing functions associated with the output inverters 31–38 of the first decoder 300 and the gate drive inverters 71–78 of the conversion decoder 500. Thus, the output inverters 101–108 of the first dual decoder 600 drive first output signals $Z_1$–$Z_8$ and the gates of the PMOS FET's 81–88. A strictly serial combination of the first decoder 300 with the conversion decoder 500 would result in the output inverters 31–38 driving the gate drive inverters 71–78. This produces an additional differential delay between outputs.

The first outputs $Z_1$–$Z_8$ are applied to the gates of the PMOS FET's 81–88 in addition to being supplied externally. The outputs of NAND gates 21–28 are applied to the gates of the NMOS FET's 91–98. In contrast, a serial combination of the prior art would have the gate drive inverters 71–78 controlling the NMOS FET's 91–98. Thus, the second circuit block receives inputs at both the gates of the NMOS FET's 91–98 and the inputs of the output inverters 101–108. The double duty usage of the output inverters allows a simpler circuit structure to be achieved, and reduces the element count of the circuit and the differential delay time of the dual outputs.

Although the first dual decoder 600 is not a strict serial connection of the decoder 300 and the conversion circuit 500, identical decoding functions are effected. Thus, the first outputs $Z_1$–$Z_8$ are generated in response to an input value x applied to line $B_1$–$B_3$ according to TRUTH TABLE 1 while the second outputs $Y_1$–$Y_7$ are generated according to TRUTH TABLE 3. These outputs are further summarized below in TRUTH TABLE 4.

The dual decoder 600 decodes the three-bit binary input signal $B_1$–$B_3$, however, it is understood that the present invention can be extended to accept inputs containing greater or fewer bits by one of ordinary skill in the art in view of this disclosure. Therefore, such a modification is considered to be within the scope and spirit of the present invention.

Figure 5:
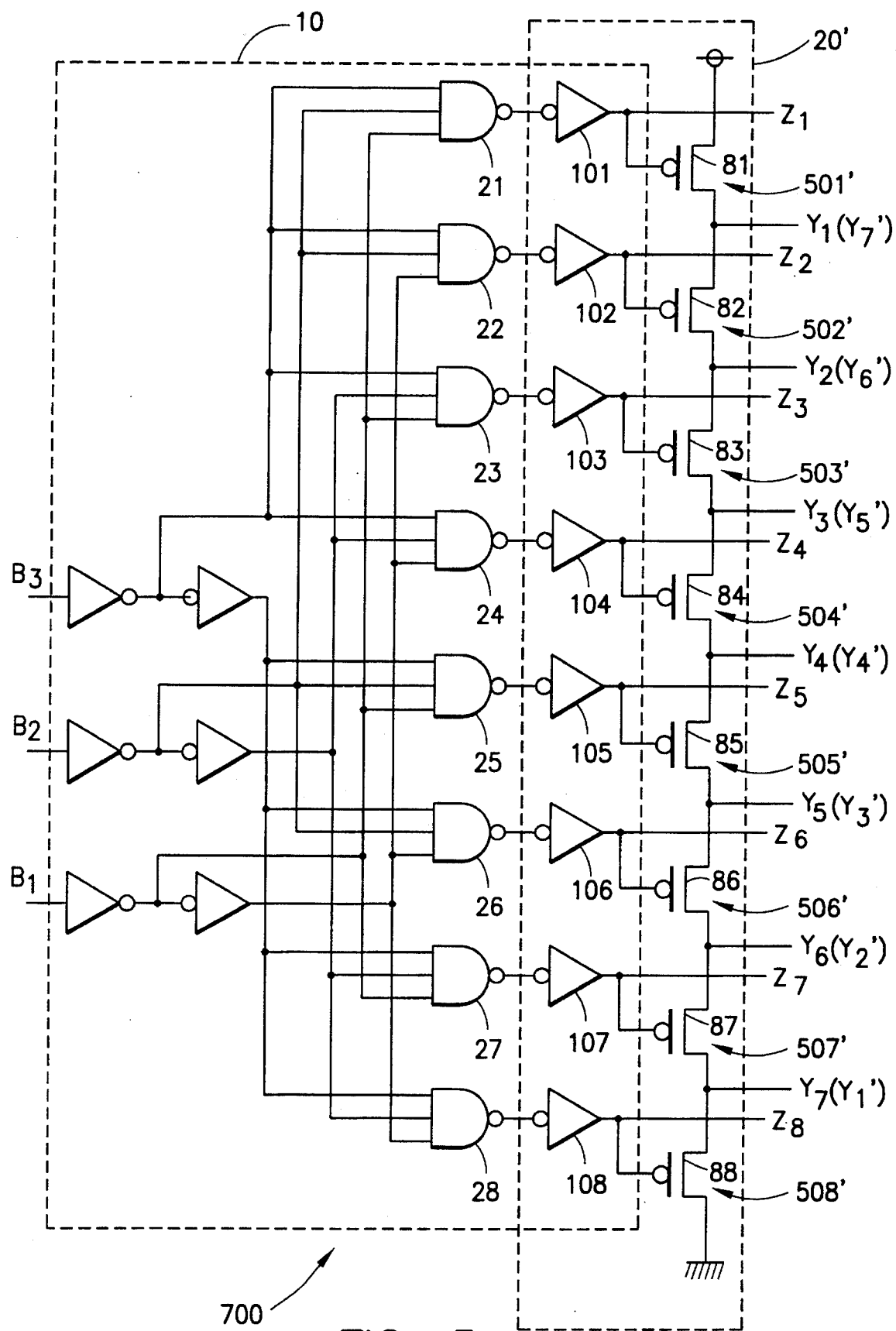
FIG. 5 shows a second dual decoder according to another embodiment of the present invention.

Referring to FIG. 5, a second dual decoder 700 of the present invention has the first decoder circuit 10 interconnected with a second conversion circuit 20'. Once again, common reference designators identify elements corresponding to those of FIG. 4. The second conversion circuit 20' is distinguished from the first conversion circuit 20 of FIG. 4 in having transmission gates 501'–508' comprised of PMOS FET's 81–88 while the transmission gates 501–508 of the first conversion circuit 20 are comprised of PMOS FET's 81–88 connected in parallel with NMOS FET's 91–98.

The transmission gates 501'–508' of the second conversion circuit 20' are serially connected between the supply potential and ground. Outputs $Y_1$–$Y_7$ are developed at junctions of the transmission gates 501'–508'. Outputs $Z_1$–$Z_8$ are produced by the first decoder circuit 10 and drive gates of respective ones of the PMOS FET's 81–88. Only one of the outputs $Z_1$–$Z_7$ are set high at a given time. The high output turns off the PMOS FET to which it is applied while all the remaining PMOS FET's are set conductive by low inputs applied to their gates. Thus, those of the outputs $Z_1$–$Z_8$ which are on the supply side of the non-conductive PMOS FET, are set high while those on the ground potential side are set low. Henceforth, if a decimal value of 4 is applied to the $B_1$–$B_3$ inputs, the output $Z_5$ is set high, transmission gate 85 is placed in a non-conductive state, and the upper outputs $Y_1$–$Y_4$ are set high while the lower outputs $Y_5$–$Y_7$ are set low. Thus, the first and second dual decoders, 600 and 700, perform the same decoding function. TRUTH TABLE 4 below summarizes the input and output states of both of the dual decoders, 600 and 700, for each possible value of x.

TABLE 4

| INPUT VALUE | FIRST OUTPUT | | | | | | | | SECOND OUTPUT | | | | | | |
|---|---|---|---|---|---|---|---|---|---|---|---|---|---|---|---|
| X | $Z_8$ | $Z_7$ | $Z_6$ | $Z_5$ | $Z_4$ | $Z_3$ | $Z_2$ | $Z_1$ | $Y'_7$ | $Y'_6$ | $Y'_5$ | $Y'_4$ | $Y'_3$ | $Y'_2$ | $Y'_1$ |
| 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 0 | 1 | 0 | 1 | 0 | 0 | 0 | 0 | 0 | 0 |
| 2 | 0 | 0 | 0 | 0 | 0 | 1 | 0 | 0 | 1 | 1 | 0 | 0 | 0 | 0 | 0 |
| 3 | 0 | 0 | 0 | 0 | 1 | 0 | 0 | 0 | 1 | 1 | 1 | 0 | 0 | 0 | 0 |
| 4 | 0 | 0 | 0 | 1 | 0 | 0 | 0 | 0 | 1 | 1 | 1 | 1 | 0 | 0 | 0 |
| 5 | 0 | 0 | 1 | 0 | 0 | 0 | 0 | 0 | 1 | 1 | 1 | 1 | 1 | 0 | 0 |
| 6 | 0 | 1 | 0 | 0 | 0 | 0 | 0 | 0 | 1 | 1 | 1 | 1 | 1 | 1 | 0 |
| 7 | 1 | 0 | 0 | 0 | 0 | 0 | 0 | 0 | 1 | 1 | 1 | 1 | 1 | 1 | 1 |
|   |   |   |   |   |   |   |   |   | $Y_1$ | $Y_2$ | $Y_3$ | $Y_4$ | $Y_5$ | $Y_6$ | $Y_7$ |

The second dual decoder 700 achieves similar and still further structural economization over that of the first dual decoder 600. As in the case of the first dual decoder 600, the output inverters 101–108 of the second dual decoder 700 serve double duty, producing the first outputs $Z_1$–$Z_8$ and driving the transmission gates 501'–508'. However, the second dual decoder 700 further simplifies the circuit structure eliminating the NMOS FET's 91–98 used in the first dual decoder 600. Thus when the gate inputs of the PMOS FET's 81–88 are low, the PMOS FET's 81–88 function as transmission gates either sourcing current from the supply potential or sinking current to ground. The second outputs $Y_1$–$Y_7$ are thus generated at corresponding junctions of the PMOS FET's 81–88.

The first and second dual decoders, 600 and 700, are suited to applications requiring both the first and second outputs, $Z_1$–$Z_8$ and $Y_1$–$Y_7$. An alternative decoding arrangement is also utilized wherein the order of significance of the second outputs $Y_1$–$Y_7$ is inverted. The alternative decoding is also provided by both of the dual decoders 600 and 700, by inverting the order of significance of the second outputs $Y_1$–$Y_7$. The alternative outputs are designated $Y'_1$–$Y'_7$ and are indicated in parenthesis in FIGS. 4 and 5. The inverted coding of the alternative outputs $Y'_1$–$Y'_7$ is shown in TRUTH TABLE 4 above. In response to a given input value x, x number of Y' outputs are set high starting from the most-significant and progressing to the least significant while the remainder are set low. For example, if x equals 4, then $Y'_7$ through $Y'_4$ are set high and $Y'_3$–$Y'_1$ are set low. Thus, there is a one-to-one correspondence between the second outputs $Y_1$–$Y_7$ and the alternative outputs $Y'_7$–$Y'_1$, respectively, for any input value of x.

The present invention thus provides dual decoders capable of producing outputs according to both above described first and second decoding methods. The dual decoders described above have structures with fewer elements and of less complexity than serial connection of prior art devices. Therefore, the dual decoders may be implemented occupying less surface area of a semiconductor substrate than possible using serial combinations of existing decoding and converting circuits.

As described above in detail, according to the present invention, a decoder is provided, which can convert a binary input into two types of outputs with a circuit configuration which is simple relative to the combination of two decoders. Accordingly, the apparatus of the present invention is advantageously fabricated with MOS FET's in an integrated circuit form.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A decoder comprising:

a first decoder circuit responsive to n binary inputs representative of a binary coded decimal value x;

said first decoder having m first outputs $Z_1$–$Z_m$ supplied through m output drivers where m= $2^n$, n≧3, and $Z_1$ is the least significant output;

said first decoder circuit including means for setting to a first state an output $Z_{x+1}$, of said first outputs $Z_1$–$Z_m$, and setting remaining ones of said first outputs $Z_1$–$Z_m$ to a second state;

said first decoder circuit including m at least three-input logic gates driving said m output drivers;

a second decoder circuit having m−1 second outputs $Y_1$–$Y_{m-1}$ wherein $Y_1$ is the least significant;

said second decoder circuit having means for setting to said first state x number of said second outputs $Y_1$–$Y_{m-1}$ in order of significance from the least significant second output $Y_1$ to a more significant second output $Y_x$ in response to said first outputs $Z_1$–$Z_m$, and setting remaining ones of said second outputs $Y_{x+1}$–$Y_{m-1}$ to said second state; and said means for setting including m transmission gates having an input gate driven by a respective one of said m output drivers of said first decoder circuit.

2. The decoder according to claim 1 wherein said m output drivers of said first decoder circuit are inverters.

3. The decoder according to claim 2 wherein each of said m transmission gates includes a P-channel FET and an N-channel FET connected in parallel; and each of said transmission gates includes a second input gate driven by an input signal applied to said respective one of said m output drivers.

4. The decoder according to claim 3 further comprising:

means for inverting said n binary inputs; and each of said m at least three-input logic gates having a different combination of said n binary inputs and inversions of said n binary inputs applied to inputs thereof.

5. The decoder according to claim 2 wherein each of said transmission gates includes a FET having said input gate driven by said respective one of said inverters.

6. The decoder according to claim 5 wherein:

said FET of each of said transmission gates is a P-channel FET; and each of said m transmission gates includes an N-channel FET connected in parallel with said P-channel FET; and each of said transmission gates includes a second input gate driven by an input signal applied to said respective one of said m output drivers.

7. The decoder according to claim 1 wherein:

said first decoder circuit includes means for inverting said n binary inputs; and each of said m at least three-input logic gates has a different combination of said n binary inputs and inversions of said n binary inputs applied to inputs thereof.

8. A decoder comprising:

a first decoder circuit responsive to n binary inputs representative of a binary coded decimal value x;

said first decoder having m first outputs $Z_1-Z_m$ supplied through m output drivers where $m=2^n$, $n \geq 3$, and $Z_1$ is the least significant output;

said first decoder circuit including means for setting to a first state an output $Z_{x+1}$, of said first outputs $Z_1-Z_m$, and setting remaining ones of said first outputs $Z_1-Z_m$ to a second state;

said first decoder circuit including m at least three-input logic gates driving said m output drivers;

a second decoder circuit having m-1 second outputs $Y'_{m-1}-Y'_1$ wherein $Y'_{m-1}$ is the least significant;

said second decoder circuit having means for setting to said first state x number of said second outputs $Y'_{m-1}-Y'_1$ in order of significance from the least significant second output $Y'_{m-1}$ to a more significant second output $Y'_{m-x}$ in response to said first outputs $Z_1-Z_m$, and setting remaining ones of said second outputs $Y'_{m-x-1}-Y'_1$ to said second state;

said means for setting including m transmission gates having an input gate driven by a respective one of said m output drivers of said first decoder circuit; and said m-1 second outputs of said second decoder circuit having an order of significance reversed relative to the order of significance given to said first outputs applied to corresponding ones of said m transmission gates.

9. The decoder according to claim 1 wherein said decoder is fabricated on an integrated circuit substrate including MOS FET's.

10. A decoder, for receiving n input bits, representative of a binary coded decimal value x, and producing first and second sets of decoded output, comprising:

a first decoder circuit responsive to said n input bits;

said first decoder having m first outputs $Z_1-Z_m$ supplied through m output drivers where $m=2^n$, $n \geq 2$, and $Z_1$ is the least significant output;

said first decoder circuit includes m logic gates driving said m output elements;

means for inverting said n binary inputs;

each of said m logic gates having means for applying different combinations of said n input bits and inversions of said n input bits to inputs of said m logic gates such that an output $Z_{x+1}$, of said first outputs $Z_1-Z_m$, is set to a first state and remaining ones of said first outputs $Z_1-Z_m$ are set to a second state;

a second decoder circuit accepting first outputs $Z_1-Z_m$ as inputs;

said second decoder circuit having m-1 second outputs $Y_1-Y_{m-1}$, where $Y_1$ is the least significant and $Y_{m-1}$ is the most significant;

said second decoder circuit having means for setting to said first state x number of said second outputs $Y_1-Y_{m-1}$ in order of significance from the least significant second output $Y_1$ to a more significant second output $Y_x$ in response to said first outputs $Z_1-Z_m$, and setting remaining ones of said second outputs $Y_{x+1}-Y_{m-1}$ to said second state;

said means for setting including m transmission gates having an input gate driven by a respective one of said m output drivers of said first decoder circuit; and each of said m transmission gates consists of only one FET.

11. The decoder according to claim 10 wherein:

said transmission gates are serially connected between a first potential and a second potential;

said second outputs $Y_1-Y_{m-1}$ are generated at junctions of said transmission gates; and said transmission gates are rendered non-conductive in response to a corresponding one of said first outputs being set to said first state.

12. A decoder, for receiving n input bits, representative of a binary coded decimal value x, and producing first and second sets of decoded output, comprising:

a first decoder circuit responsive to said n input bits;

said first decoder having m first outputs $Z_1-Z_m$ supplied through m output drivers where $m=2^n$, $n \geq 2$, and $Z_1$ is the least significant output;

said first decoder circuit includes m logic gates driving said m output elements;

means for inverting said n binary inputs;

each of said m logic gates having means for applying different combinations of said n input bits and inversions of said n input bits to inputs of said m logic gates such that an output $Z_{x+1}$, of said first outputs $Z_1-Z_m$, is set to a first state and remaining ones of said first outputs $Z_1-Z_m$ are set to a second state;

a second decoder circuit accepting first outputs $Z_1-Z_m$ as inputs;

said second decoder circuit having m-1 second outputs $Y'_{m-1}-Y'_1$, where $Y'_{m-1}$ is the least significant and $Y'_1$ is the most significant;

said second decoder circuit having means for setting to said first state x number of said second outputs $Y'_{m-1}-Y'_1$ in order of significance from the least significant second output $Y_{m-1}$ to a more significant second output $Y_{m-x}$ in response to said first outputs $Z_1-Z_m$, and setting remaining ones of said second outputs $Y_{m-x-1}-Y_1$ to said second state;

said means for setting including m transmission gates having an input gate driven by a respective one of said m output drivers of said first decoder circuit;

each of said m transmission gates consists of only one FET; and said m-1 second outputs of said second decoder circuit having an order of significance reversed relative to the order of significance given to said first outputs applied to corresponding ones of said m transmission gates.

* * * * *